(12) United States Patent
Borrvall

(10) Patent No.: US 8,271,237 B2
(45) Date of Patent: Sep. 18, 2012

(54) FULLY-INTEGRATED HEXAHEDRAL ELEMENTS CONFIGURED FOR REDUCING SHEAR LOCKING IN FINITE ELEMENT METHOD

(75) Inventor: Thomas Borrvall, Linköping (SE)

(73) Assignee: Livermore Software Technology Corporation, Livermore, CA (US)

(*) Notice: Subject to any disclaimer, the term of this patent is extended or adjusted under 35 U.S.C. 154(b) by 391 days.

(21) Appl. No.: 12/698,839

(22) Filed: Feb. 2, 2010

(65) Prior Publication Data

US 2011/0191072 A1 Aug. 4, 2011

(51) Int. Cl.
*G06F 7/60* (2006.01)
*G06G 7/48* (2006.01)

(52) U.S. Cl. .............................. 703/2; 703/7
(58) Field of Classification Search .............. 703/2, 7
See application file for complete search history.

(56) References Cited

U.S. PATENT DOCUMENTS

| | | | |
|---|---|---|---|
| 6,044,210 A | 3/2000 | Nagtegaal | |
| 6,697,770 B1* | 2/2004 | Nagetgaal | 703/2 |
| 7,392,163 B1* | 6/2008 | Bindeman | 703/2 |
| 7,499,050 B2* | 3/2009 | Wu et al. | 345/420 |
| 7,698,112 B2* | 4/2010 | Fischer et al. | 703/2 |

OTHER PUBLICATIONS

EPO Extended Search Report for Application Ser. No. 10195557.3-2224 Issued Mar. 23, 2011.
Schwarze M et. al. "Sheet Metal Forming and Springback Simulation by Means of a New Reduced Integration Solid-Shell Finite Element Technology" Computer Methods in Applied Mechanics and Engineering, North-Holland, Amsterdam, NL, vol. 200, No. 5-8, Oct. 15, 2010 pp. 454-476.
Abed-Meraim F et al. "SHB8PS—a new adaptive, assumed-strain continuum mechanics shell element for impact analysis" Computers and Structures, Pergamon Press, GB, vol. 80, No. 9-10, Apr. 1, 2002, pp. 791-803.
Olovsson L et al. "Shear locking reduction in eight-node tri-linear solid finite elements", Computers and Structures, Pergamon Press, GB, vol. 84, No. 7, Feb. 1, 2006, pp. 476-484.
Naroei K et al. "A study on sheet formability by a stretch-forming process using assumed strain FEM" Journal of Engineering Mathematics, Kluwer Academic Publishers, DO, vol. 65, No. 4, Jul. 30, 2009, pp. 311-324.
EPO Extended Search Report for Application Ser. No. 10186506.1-2224, Jan. 12, 2011.

* cited by examiner

*Primary Examiner* — Kandasamy Thangavelu
*Assistant Examiner* — Nithya Janakiraman
(74) *Attorney, Agent, or Firm* — Roger H. Chu

(57) ABSTRACT

Improved 8-node hexahedral elements configured for reducing shear locking in finite element method are disclosed. According to one aspect, aspect-ratio based scale factors are introduced to modify partial derivatives of the isoparametric shape function of the hexahedral element with respect to isoparametric dimensions, respectively. The modified derivatives are used for calculating the Jacobian matrix thereby the rate-of-strain. The scale factor is configured such that no changes for a perfect cubic solid element (i.e., element having aspect ratio of 1 (one) in all three spatial dimensions), while significant changes for element having poor aspect ratio. In other words, elements with poor aspect ratio are mapped to a perfect cubic element using the aspect-ratio based scale factors. According to anther aspect, off-diagonal components in the local Jacobian matrix are directly modified by cancelling terms related to spurious shear deformation modes. This measure completely alleviates the shear locking effect even for perfectly shaped elements.

8 Claims, 7 Drawing Sheets

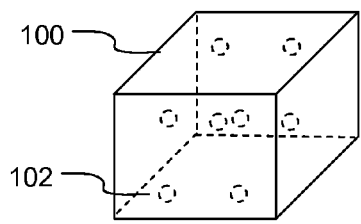
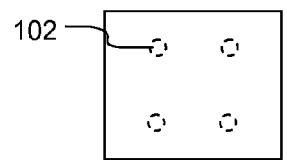
FIG. 1A    FIG. 1B
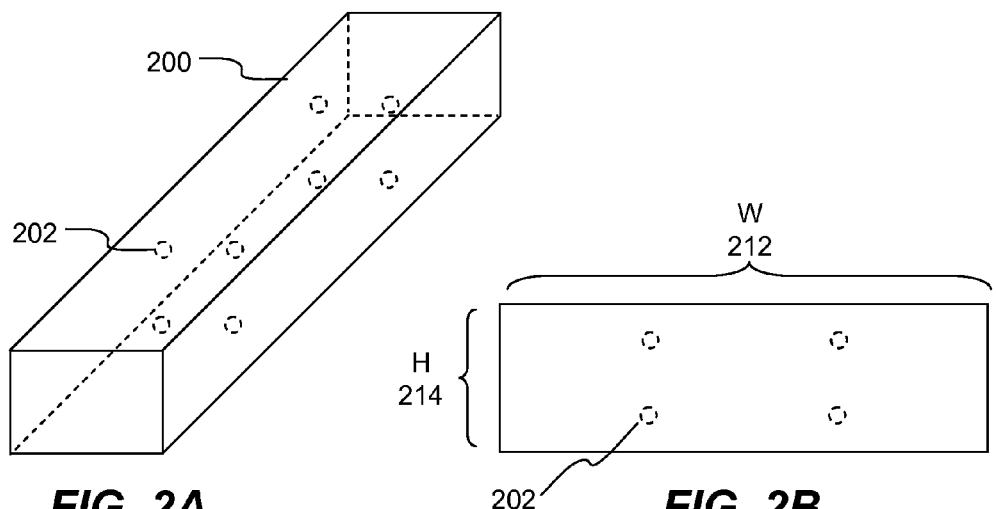
FIG. 2A    FIG. 2B

FULLY-INTEGRATED HEXAHEDRAL ELEMENTS CONFIGURED FOR REDUCING SHEAR LOCKING IN FINITE ELEMENT METHOD

FIELD OF THE INVENTION

The present invention generally relates to computer aided engineering analysis (e.g., analysis based on finite element method), more particularly to fully-integrated hexahedral or solid or brick elements configured for reducing shear locking in finite element method, which can be used in a time-marching engineering simulation for assisting users to make decision in improvement of an engineering product (e.g., car, airplane, their components) design.

BACKGROUND OF THE INVENTION

The finite element method (FEM) (sometimes referred to as finite element analysis (FEA)) is a numerical technique for finding approximate solutions of partial differential equations (PDE) as well as of integral equations. The solution approach is based either on eliminating the differential equation completely (steady state problems), or rendering the PDE into an approximating system of ordinary differential equations, which are then numerically integrated using standard techniques such as Euler's method, Runge-Kutta, etc.

In simulating structural mechanics, an engineering structure or product (e.g., car, cellular phone, airplane, etc.) can be modeled with a set of finite elements interconnected through nodal points or nodes. Each finite element is configured to have a shape and physical properties such as density, Young's modulus, shear modulus and Possion's ratio, and alike. Finite element can be one-, two- or three-dimensional. In general, a three-dimensional element is referred to as a solid element (i.e., a finite element having a volume). One of the most common solid elements is 8-node hexahedral element 100 or brick element shown in FIG. 1A. Eight-node hexahedral element 100 is a first order finite element that contains eight corner nodes. Shown in FIG. 1B is a two-dimensional view from one side of the 8-node hexahedral element of FIG. 1A.

To evaluate finite element results (e.g., nodal forces being generated by stress within an element), each hexahedral element is configured with one or more integration points for numerical integration, for example, Gauss-Legendre quadrature numerical integration scheme. Numerical integration of a hexahedral element can be done with a single Gauss-Legendre integration point. Such element is referred to as an under-integrated or rank deficient element (not shown). Alternatively, a hexahedral element 100 uses two Gauss-Legendre integration points 102 in each spatial direction for a total of eight points. Such element is said to have full integration or rank sufficient integration. Full integration guarantees that all possible modes of deformation generate stress in the element.

Further, finite element method uses a set of shape functions $N_j$ for each element to construct approximated displacement $u^h$ anywhere within the element in accordance with the following formula:

$$u^h = \sum_i N_i u_i$$

where $u_i$ is the nodal displacement. Each node has three translational displacements, therefore, i is 24 for an 8-node hexahedral element (i.e., 8 nodes with each having three displacements).

A fully integrated 8-node hexahedral element suffers from what is referred to as shear locking effect, which means that a built-in artificial shear stiffness for certain deformation modes due to the placement of the integration points. This spurious stiffness is even more prominent for elements with poor aspect ratio, i.e., for element with one of the spatial dimensions substantially larger than another. For example, shown in FIG. 2A, an elongated hexahedral element 200 is said to have a poor aspect ratio (i.e., substantially deviated from 1). To better view the relationship between the integration points 202 and the element 200, a two-dimensional view of the element is shown in FIG. 2B. The aspect ratio is defined as ratio of respective lengths of two sides, W 212 and H 214 in FIG. 2B. In three-dimension, there are three aspect ratios one for each spatial dimension.

Sometimes it is more advantageous to create a finite element analysis model with solid elements with poor aspect ratio due to geometry of an engineering product or structure (e.g., a thin-walled structure). The advantage includes at least the following: 1) easier to create the model; and 2) more computational efficient due to less number of elements in the model.

Generally, a fully-integrated 8-node solid element has a numerical deficiency referred to as transverse shear locking in simulating pure bending. And the shear locking effect is amplified when the solid elements have poor aspect ratio. FIG. 3A is a two-dimensional side view showing shear locking effect of an 8-node solid element. Diagram 310 of FIG. 3A shows a realistic pure bending of a prism or elongated structure, while diagram 320 of FIG. 3B shows a poor aspect ratio 8-node solid element under the same bending moment 300. It is evident that 8-node hexahedral element presents no curvature between nodes; therefore, the 8-node hexahedral element is numerically too stiff in comparison to the true structural behaviors it supposed to simulate. For fully-integrated 8-node solid element, integration points (202 of FIG. 2A) are not located in the centroid of the solid element and whence this shear locking effect.

One prior art approach to solve this shear locking problem is to use higher order elements, for example, 20-node element (one additional node per edge, not shown). However, the computation costs associated with the higher order elements prevent practical usage in any real world production situations. It would, therefore, be desirable to provide an improved 8-node hexahedral element configured for reducing shear-locking in finite element method.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

An improved 8-node hexahedral element configured for reducing shear locking in finite element method is disclosed. Fully-integrated hexahedral element is configured for eight corner nodes and eight integration points.

According to one aspect of the present invention, aspect-ratio based scale factors are introduced to modify partial derivatives of the isoparametric shape function of an 8-node hexahedral element with respect to isoparametric dimensions, respectively. The modified derivatives are used for calculating the Jacobian matrix thereby the rate-of-strain. The scale factor is configured such that no changes for a perfect cubic solid element (i.e., element having aspect ratio of 1 (one) in all three spatial dimensions), while significant changes for element having poor aspect ratio. In other words, elements with poor aspect ratio are mapped to a perfect cubic element using the aspect-ratio based scale factors.

As a result, artificial numerical transverse shear locking effect is reduced in the structural responses obtained through the finite element analysis using such approach described above.

According to another aspect of the present invention, off-diagonal components in the local Jacobian matrix are directly modified by cancelling terms related to spurious shear deformation modes. This measure completely alleviates the artificial shear locking effect even for perfectly shaped elements (i.e., cubic element with aspect ratio of one).

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 1A is a perspective view showing an exemplary 8-node hexahedral or solid element;

FIG. 1B is a two-dimensional view showing one side of the solid element of FIG. 1A.

FIG. 2A is a perspective view showing an exemplary 8-node hexahedral element with poor aspect ratio;

FIG. 2B is a two-dimensional view showing one side of the solid element of FIG. 2A;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 4A-6. However, those skilled in the art will readily appreciate that the detailed description given herein with respect to these figures is for explanatory purposes as the invention extends beyond these limited embodiments.

Figure 3A:
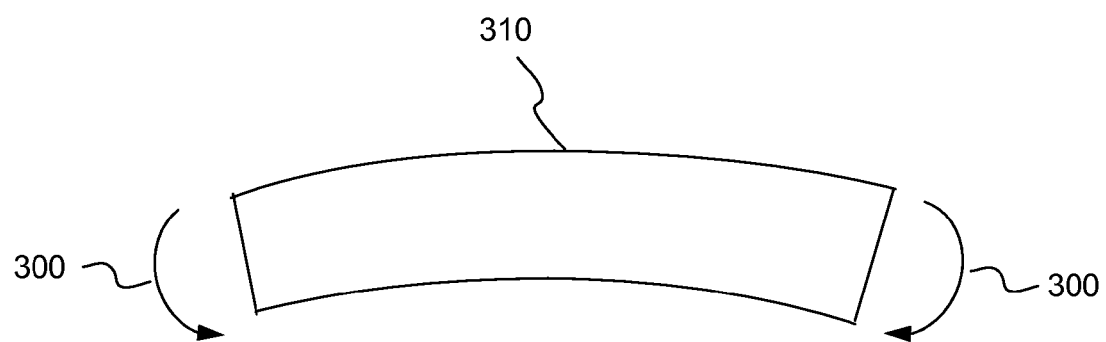
FIG. 3A is a two-dimensional side view showing a deformed shape of an elongated structure under pure bending moment.
Figure 3B:
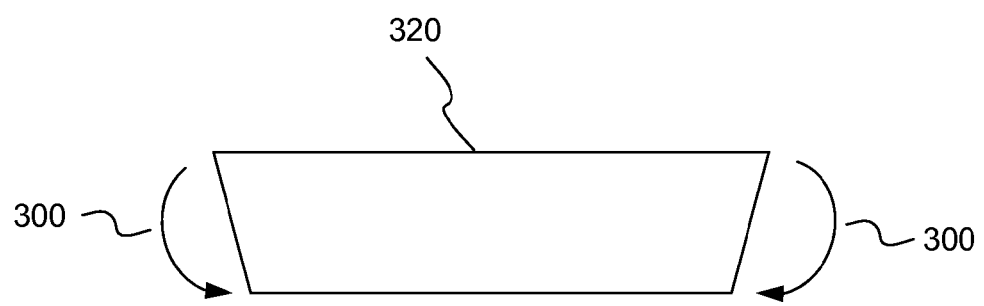
FIG. 3B is a diagram showing one side of an 8-node hexahedral element configured for simulating the elongated structure under the same bending moment of FIG. 3A.
Figure 4A:
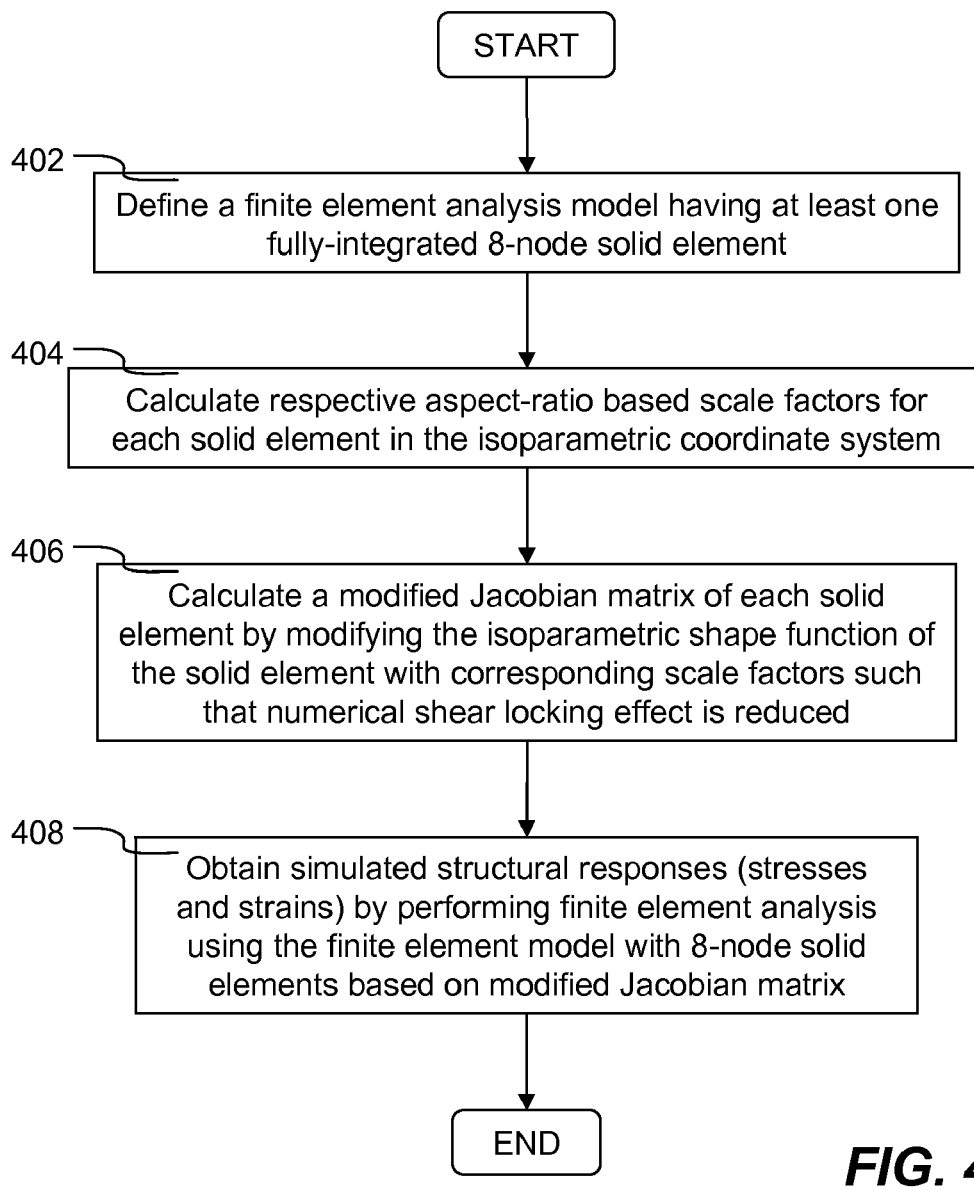
FIG. 4A is a flowchart illustrating an exemplary process of reducing transverse shear locking effect of an 8-node hexahedral element used in a finite element analysis, according to embodiments of the present invention.

Referring first to FIG. 4A, there is shown a flowchart illustrating an exemplary process 400 of reducing transverse shear locking effect of an 8-node hexahedral element in a finite element analysis, according to an embodiment of the present invention. Process 400 is preferably implemented in software. The finite element analysis is used for simulating structural behavior of an engineering product (e.g., car, airplane, structure, consumer product) such that user of the finite element analysis (e.g., engineer, scientist, etc.) can make a better design decision as to how to improve the product.

Process 400 starts, at step 402, by defining a finite element analysis (FEA) model in a computer system configured for performing finite element analysis. The FEA model defines an engineering product to be designed or improved, for example, an automobile, a structure, a consumer product, etc. A time-marching engineering simulation using FEA is performed to evaluate structural responses or behaviors of the engineering product under a design loading. The time-marching simulation comprises a number of time steps or solution cycles. The FEA model includes at least one fully-integrated 8-node hexahedral element (e.g., element shown in FIGS. 1A and 2A).

Figure 5A:
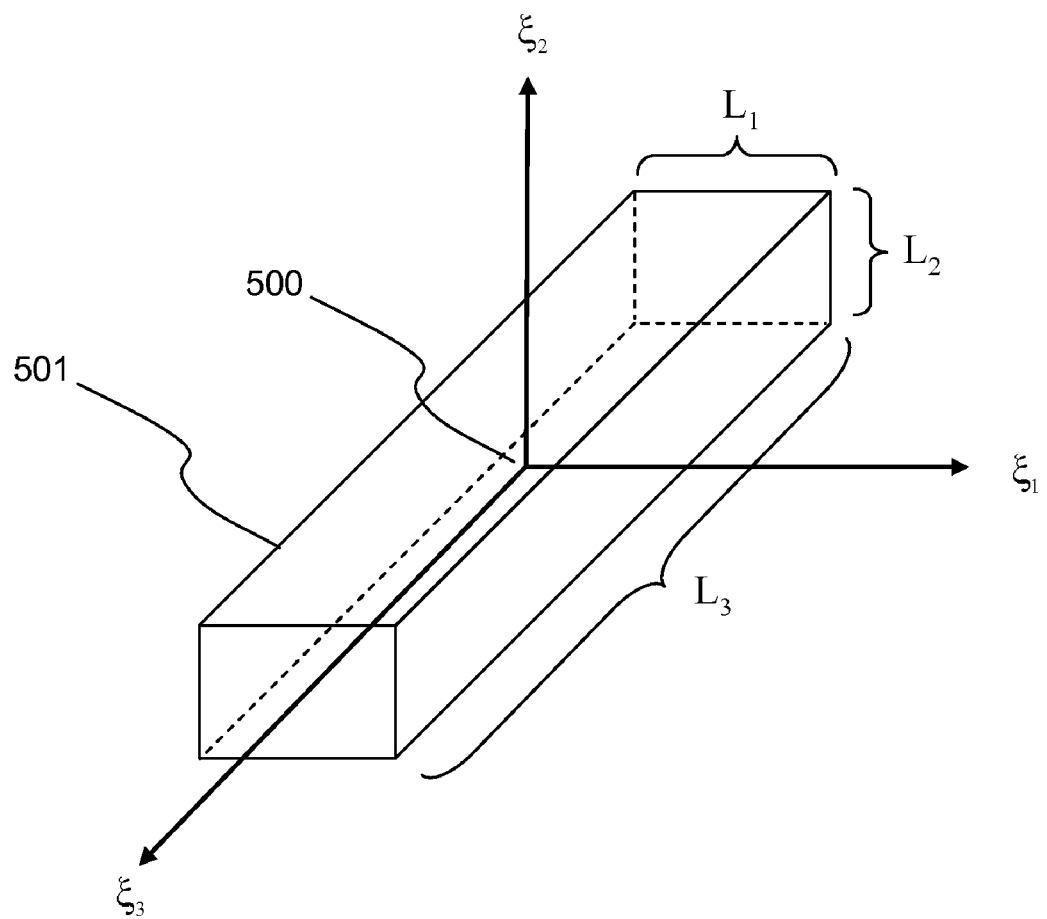
FIG. 5A is a diagram showing an exemplary three-dimensional isoparametric coordinate system of an 8-node hexahedral element in accordance with one embodiment of the present invention.

According a first embodiment, at step 404, for each of the 8-node hexahedral element, three aspect-ratio based scale factors one for each spatial direction are calculated in an isoparametric coordinate system 500 of the 8-node solid element 501 shown in FIG. 5A. $\xi_1$, $\xi_2$ and $\xi_3$ are the three isoparametric coordinates configured to define the 8-node solid element. The aspect-ratio based scale factors $\lambda_i^j$ are calculated as follows:

$$\lambda_i^j = \min\left(1, \frac{L_j}{L_i}\right) \quad i, j = 1, 2, 3 \qquad (1)$$

where $L_1$, $L_2$ and $L_3$ are corresponding lengths of the solid element in three isoparametric directions, respectively. A graphical illustration is shown in FIG. 5A. Because the result of min(a,b) is either "a" or "b", whichever is smaller, the aspect-ratio based scale factors are always equal to or less than 1.

Next at step 406, the aspect-ratio based scale factors are applied to modify partial derivatives $\gamma_j^I$ of the isoparametric shape function $N_I$ of the 8-node solid element used in the calculation of Jacobian matrix as follows:

$$\gamma_j^I = \frac{\partial N_I}{\partial \xi_j}(\lambda_1^j \xi_1, \lambda_2^j \xi_2, \lambda_3^j \xi_3) \quad j = 1, 2, 3 \quad (2)$$

Figure 5B:
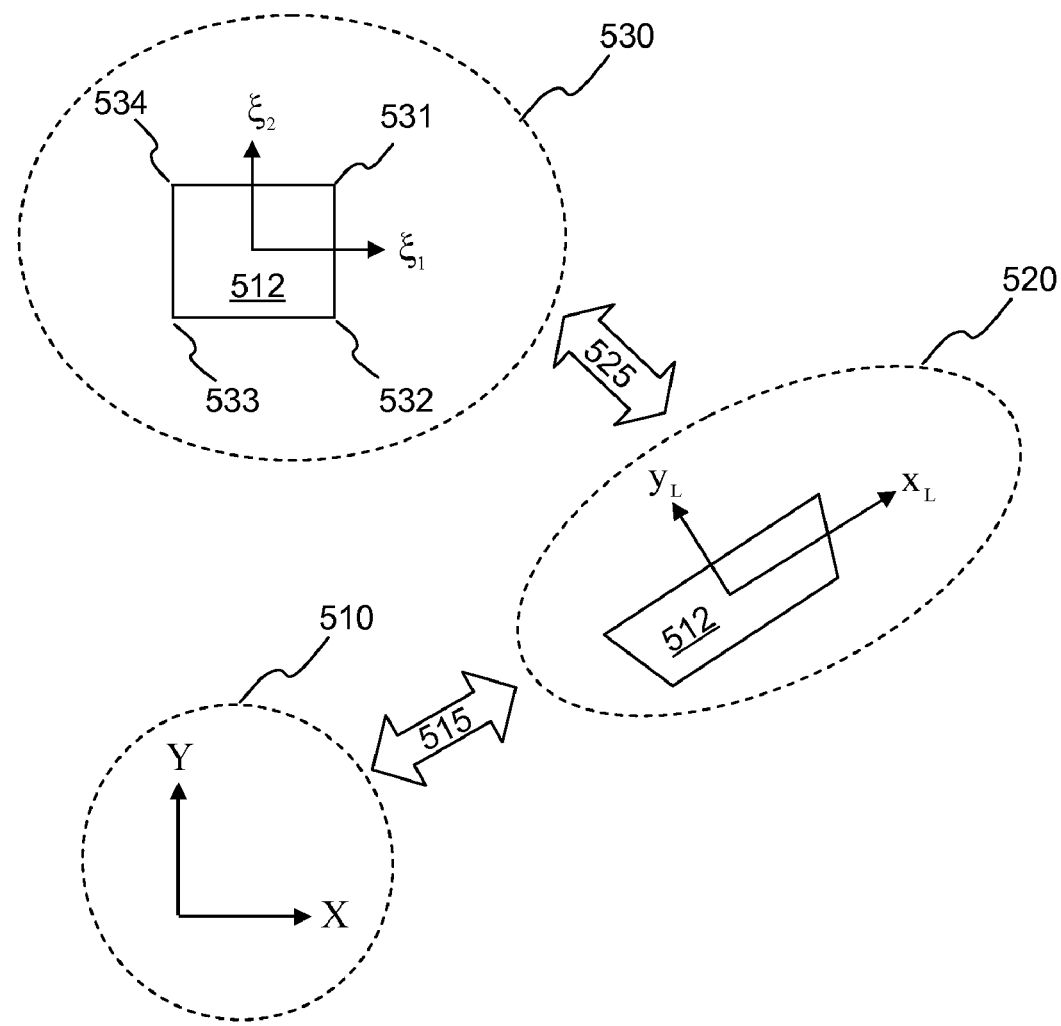
FIG. 5B is a diagram showing various coordinate systems used for 8-node hexahedral element in accordance with one embodiment of the present invention.

The derivatives $\gamma_j^I$ are then used for modifying the relevant components of the Jacobian matrix's off-diagonal terms such that artificial numerical shear locking effect is reduced. To demonstrate this modification, three coordinate systems are required and shown in FIG. 5B. For illustrating simplicity, the coordinate systems are shown in two dimensions (2-D). For those of ordinary skilled in the art would know the three-dimensional coordinate systems are simply an extension from the two-dimensional ones. First, element 512 (in three-dimension, this would be an 8-node solid element) is shown in a global coordinate system (X-Y) 510 and a local spatial coordinate system ($x_L$-$y_L$) 520. The relationship between the global and local coordinate systems can be represented by a transformation (shown as arrow 515). The global coordinate system 510 is generally configured for defining the finite element analysis model in its entirety. The local spatial coordinate system 520 is configured for computing the aspect ratio as well as properly modifying the Jacobian matrix. Origin of the local spatial coordinate system 520 can be set anywhere (the one shown in FIG. 5B is in the center of the element).

The element 512 can also be represented in an isoparametric coordinate system ($\xi_1$-$\xi_2$) 530 (similar to the one shown in FIG. 5A). The isoparametric coordinates of the four corner nodes 531-534 are (1,1), (1,−1), (−1,−1) and (−1,1), respectively. Similarly, a transformation (shown as arrow 525) represents the relationship between the isoparametric coordinate system 530 and the local spatial coordinate system 520. This transformation is the local Jacobian matrix $\overline{J}^L$ expressed as:

$$\overline{J}^L = \frac{\partial \overline{x}^L}{\partial \overline{\xi}} = \sum_I \overline{x}_I^L \frac{\partial N_I}{\partial \overline{\xi}} = \sum_I \overline{x}_I^L \gamma^I \quad (3)$$

where $\overline{x}^L$ is the local spatial coordinates (e.g., ($x_L$,$y_L$) in 2-D), $\overline{\xi}$ is the isoparametric coordinates (e.g., ($\xi_1$, $\xi_2$) in 2-D). The last expression of Eq. (3) is obtained by using Eq. (2).

Figure 4B:
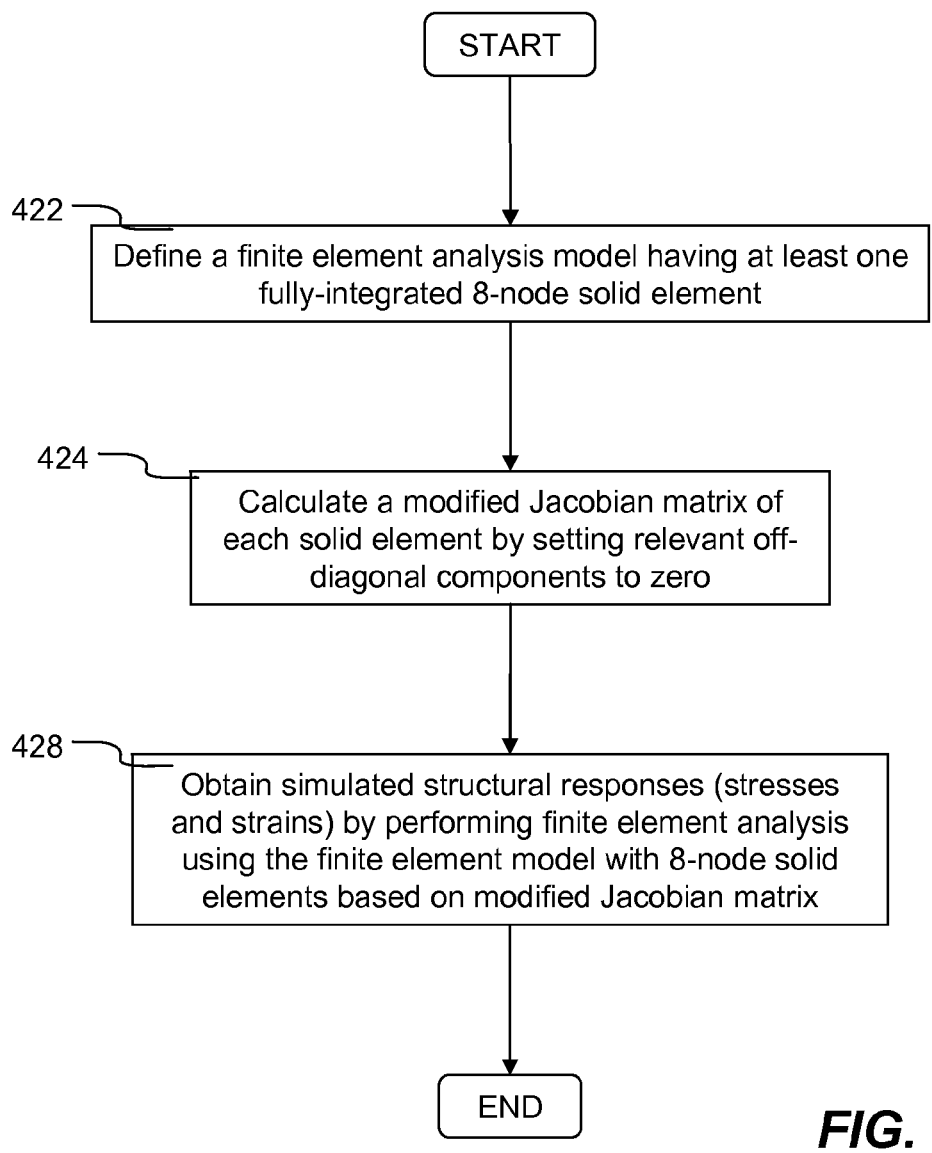
FIG. 4B is a flowchart illustrating another exemplary process of reducing transverse shear locking effect, according to another embodiment of the present invention.

In a second embodiment shown in FIG. 4B, the present invention achieves the objective of eliminating spurious shear locking effect by setting relevant off-diagonal components of the local Jacobian matrix to zero. In component form, the local Jacobian matrix $\overline{J}^L$ can be written in a polynomial form in terms of isoparametric coordinates:

$$J_{ij}^L = \alpha_{ij}^L \xi_i + \ldots \quad (4)$$

no sum for $i^{th}$ row of $\overline{J}^L$, where i≠j and with some $\alpha_{ij}^L$ that depend one of the local spatial coordinates. Artificial transverse shear locking effect is caused by the term $\alpha_{ij}^L$. One can simply set this constant to zero ($\alpha_{ij}^L$=0) to eliminate such shear locking effects (step 424 of FIG. 4B).

The calculation of the Jacobian matrix can be made using the Jacobian-coordinate transformation matrix $\overline{B}$. Using indicial notation and summation over repeated indeces, Jacobian matrix of a fully-integrated 8-node solid element can be written as follows:

$$J_{ij} = \sum_k B_{ijk}^I x_k^I = \sum_{p,m,k} q_{ip}^{-1} C_{pjm}^I q_{mk} x_k^I \quad i,j = 1,2,3 \quad (5)$$

where $q_{ik}$ represents the transformation between local and global coordinate systems, and $C_{ijk}^I$ is the Jacobian-coordinate transformation matrix in the local spatial coordinate system. Matrix $\overline{B}$ contains 216 (9×24) terms. Nine terms are components in the 3×3 Jacobian matrix, while the 24 terms represent spatial terms for eight integration points (i.e., 3 spatial displacements per point).

In practice, setting of the term $\alpha_{ij}^L$ to zero causes the Jacobian-coordinate transformation matrix $\overline{B}$ to become a full dense matrix with 216 terms. This might be computational undesirable because the original method requires only 72 terms (i.e., an approximately three times more computationally expensive) for explicit solver in FEA. However, this scheme can be used in the implicit solver, where majority of computational costs is in the equation solver. The reason for causing a full dense matrix is because matrix $C_{ijk}^I$ in the standard isoparametric approach may be written as follows:

$$C_{ijk}^I = \delta_{ik} \gamma_j^I \quad (6)$$

where $\delta_{ik}$ is Kronecker delta and $\gamma_j^I$ is as follows:

$$\gamma_j^I = \frac{\partial N_I}{\partial \xi_j}(\xi_1, \xi_2, \xi_3) \quad j = 1, 2, 3 \quad (7)$$

where $N_1$ is the shape function in isoparametric coordinate system. By setting the term $\alpha_{ij}^L$ to zero, the sparsity of $C_{ijk}^I$ in Eq. (6) is destroyed and whence also the sparsity in matrix $\overline{B}$.

Referring back to the first embodiment, the scale factors of Eq. (1) and the modified partial derivatives of Eq. (2) are configured for reducing the artificial transverse shear locking effect of fully-integrated 8-node hexahedral element. This modification preserves the computational efficiency and alters the properties of those solid elements having poor aspect ratio. For perfect cubic shape solid elements, the scale factors are equal to one based on Eq. (1). As a result, partial derivatives of the original shape function (Eq. (7)) are preserved (i.e., Eq. (2) and Eq. (7) are exactly the same). Jacobian matrix of those elements having large aspect ratio is significantly modified by the scale factors in accordance with Eqs. (1) and (2), therefore, the transverse shear locking effect is reduced.

Next at step 408 of process 400, after the modified Jacobian matrix is calculated for each 8-node solid element in the finite element analysis model, the finite element analysis is performed to obtain the structural responses of the engineering product in a time-marching simulation. The simulation results or structural responses are used for assisting user (e.g., engineers, scientists) to make design decision in improvement of the engineering product.

Referring now to FIG. 4B, there is shown a flowchart showing another exemplary process 420 of reducing shear locking effect of an 8-node fully-integrated solid element in accordance with another embodiment of the present invention. Similar to process 400, process 420 is preferably implemented in software.

Process 420 comprises substantially similar or same steps with those of process 400, for example, step 422 is the same as step 402 of process 400, while step 428 with step 408. Step 424 comprises calculations of a modified Jacobian matrix. It is accomplished by setting relevant off-diagonal components to zero. These relevant terms are the source of artificial shear locking effect. Locations of the relevant terms are defined in Eq. (4).

Figure 6:
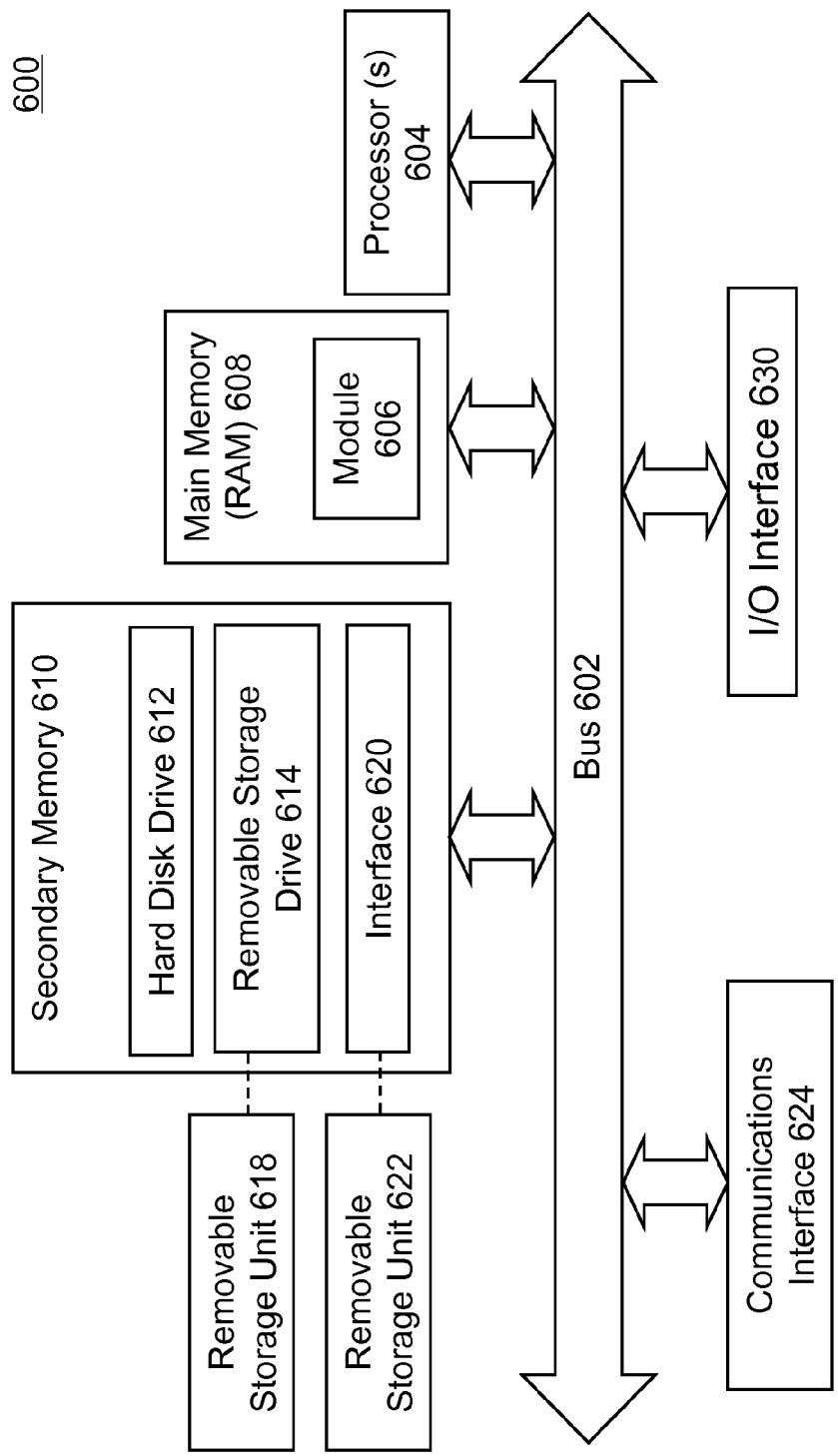
FIG. 6 is a function diagram showing salient components of a computing device, in which an embodiment of the present invention may be implemented.

According to one aspect, the present invention is directed towards one or more computer systems capable of carrying out the functionality described herein. An example of a computer system 600 is shown in FIG. 6. The computer system 600 includes one or more processors, such as processor 604. The processor 604 is connected to a computer system internal communication bus 602. Various software embodiments are described in terms of this exemplary computer system. After reading this description, it will become apparent to a person skilled in the relevant art(s) how to implement the invention using other computer systems and/or computer architectures.

Computer system 600 also includes a main memory 608, preferably random access memory (RAM), and may also include a secondary memory 610. The secondary memory 610 may include, for example, one or more hard disk drives 612 and/or one or more removable storage drives 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc. which is read by and written to by removable storage drive 614. As will be appreciated, the removable storage unit 618 includes a computer readable medium having stored therein computer software and/or data.

In alternative embodiments, secondary memory 610 may include other similar means for allowing computer programs or other instructions to be loaded into computer system 600. Such means may include, for example, a removable storage unit 622 and an interface 620. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 622 and interfaces 620 which allow software and data to be transferred from the removable storage unit 622 to computer system 600. In general, Computer system 600 is controlled and coordinated by operating system (OS) software, which performs tasks such as process scheduling, memory management, networking and I/O services.

There may also be a communications interface 624 connecting to the bus 602. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc.

The computer 600 communicates with other computing devices over a data network based on a special set of rules (i.e., a protocol). One of the common protocols is TCP/IP (Transmission Control Protocol/Internet Protocol) commonly used in the Internet. In general, the communication interface 624 manages the assembling of a data file into smaller packets that are transmitted over the data network or reassembles received packets into the original data file. In addition, the communication interface 624 handles the address part of each packet so that it gets to the right destination or intercepts packets destined for the computer 600.

In this document, the terms "computer recordable storage medium", "computer recordable medium" and "computer readable medium" are used to generally refer to media such as removable storage drive 614, and/or a hard disk installed in hard disk drive 612. These computer program products are means for providing software to computer system 600. The invention is directed to such computer program products.

The computer system 600 may also include an input/output (I/O) interface 630, which provides the computer system 600 to access monitor, keyboard, mouse, printer, scanner, plotter, and alike.

Computer programs (also called computer control logic) are stored as application modules 606 in main memory 608 and/or secondary memory 610. Computer programs may also be received via communications interface 624. Such computer programs, when executed, enable the computer system 600 to perform the features of the present invention as discussed herein. In particular, the computer programs, when executed, enable the processor 604 to perform features of the present invention. Accordingly, such computer programs represent controllers of the computer system 600.

In an embodiment where the invention is implemented using software, the software may be stored in a computer program product and loaded into computer system 600 using removable storage drive 614, hard drive 612, or communications interface 624. The application module 606, when executed by the processor 604, causes the processor 604 to perform the functions of the invention as described herein.

The main memory 608 may be loaded with one or more application modules 606 that can be executed by one or more processors 604 with or without a user input through the I/O interface 630 to achieve desired tasks. In operation, when at least one processor 604 executes one of the application modules 606, the results are computed and stored in the secondary memory 610 (i.e., hard disk drive 612). The status of the time-marching engineering simulation using finite element analysis method (e.g., deformed element, response of the 8-node solid element, etc.) is reported to the user via the I/O interface 630 either in a text or in a graphical representation.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas illustration of coordinate systems and elements are shown in two-dimensional views, the present invention is directed to a more general three-dimensional element. In summary, the scope of the invention should not be restricted to the specific exemplary embodiments disclosed herein, and all modifications that are readily suggested to those of ordinary skill in the art should be included within the spirit and purview of this application and scope of the appended claims.

I claim:

1. A method of reducing transverse shear locking effects of a fully-integrated 8-node hexahedral element in finite element analysis comprising:

defining, in a computer system, a finite element analysis model having at least one fully-integrated 8-node hexahedral element, said finite element analysis model representing an engineering product;

calculating a set of aspect-ratio based scale factors for each of the at least one fully-integrated 8-node hexahedral element, wherein the aspect-ratio based scale factors are defined according to formula:

$$\lambda_i^j = \min\left(1, \frac{L_j}{L_i}\right) \; i, j = 1, 2, 3$$

where $L_1$, $L_2$ and $L_3$ are respective lengths in three isoparametric dimensions of said each of the at least one fully-integrated 8-node hexahedral element, and $\lambda_i^j$ represents one of the aspect-ratio based scale factors;

creating an isoparametric Jacobian matrix of said each of the at least one fully-integrated 8-node hexahedral element by modifying, the isoparametric Jacobian matrix's off-diagonal terms with partial derivatives of an isoparametric shape functios ($N_I$) that is derived from aspect-ratio based scale factors such that said each of the at least one fully-integrated 8-node hexahedral element's transverse shear locking effects are reduced; and conducting an engineering simulation using finite element analysis in the computer system with the finite element analysis model having the at least one fully-integrated 8-node hexahedral element and the modified isoparametric Jacobian matrix, the engineering simulation's results are used for assisting a user in making design decisions for improving the engineering product.

2. The method of claim 1, wherein said each of the at least one fully-integrated 8-node hexahedral element has three local spatial dimensions.

3. The method of claim 1, wherein said partial derivatives of the isoparametirc shape function are modified from $$\frac{\partial N_I}{\partial \xi_j}(\xi_1, \xi_2, \xi_3) \text{ to } \frac{\partial N_I}{\partial \xi_j}(\lambda_1^j \xi_1, \lambda_2^j \xi_2, \lambda_3^j \xi_3), j = 1, 2, 3,$$

where $\xi_1$, $\xi_2$, and $\xi_3$ are isoparametric coordinates in the three isoparametric dimensions, respectively.

4. The method of claim 1, wherein said each of the at least one fully-integrated 8-node hexahedral element comprises 8 integration points.

5. A system for reducing transverse shear locking effects of a fully-integrated 8-node hexahedral element in finite element analysis comprising:

a main memory for storing computer readable code for a finite element analysis application module;

at least one processor coupled to the main memory, said at least one processor executing the computer readable code in the main memory to cause the finite element analysis application module to perform operations by a method of:

defining a finite element analysis model having at least one fully-integrated 8-node hexahedral element, said finite element analysis model representing an engineering product;

calculating a set of aspect-ratio based scale factors for each of the at least one fully-integrated 8-node hexahedral element, wherein the aspect-ratio based scale factors are defined according to formula:

$$\lambda_i^j = \min\left(1, \frac{L_j}{L_i}\right) i, j = 1, 2, 3$$

where $L_1$, $L_2$ and $L_3$ are respective lengths in three isoparametric dimensions of said each of the at least one fully-integrated 8-node hexahedral element, and $\lambda_i^j$ represents one of the aspect-ratio based scale factors;

creating an isoparametric Jacobian matrix of said each of the at least one fully-integrated 8-node hexahedral element by modifying, the isoparametric Jacobian matrix's off-diagonal terms with partial derivatives of an isoparametric shape function ($N_I$) that is derived from aspect-ratio based scale factors such that said each of the at least one fully-integrated 8-node hexahedral element's transverse shear locking effects are reduced; and conducting an engineering simulation using finite element analysis with the finite element analysis model having the at least one fully-integrated 8-node hexahedral element and the modified isoparametric Jacobian matrix, the engineering simulation's results are used for assisting a user in making design decisions for improving the engineering product.

6. The system of claim 5 wherein said partial derivatives of the isoparametric shape function are modified from $$\frac{\partial N_I}{\partial \xi_j}(\xi_1, \xi_2, \xi_3) \text{ to } \frac{\partial N_I}{\partial \xi_j}(\lambda_1^j \xi_1, \lambda_2^j \xi_2, \lambda_3^j \xi_3), j = 1, 2, 3,$$

where $\xi_1$, $\xi_2$, and $\xi_3$ are isoparametric coordinates in the three isoparametric dimensions, respectively.

7. A computer readable medium containing instructions for controlling a computer system for reducing transverse shear locking effects of a fully-integrated 8-node hexahedral element in finite element analysis by a method comprising:

defining, in a computer system, a finite element analysis model having at least one fully-integrated 8-node hexahedral element, said finite element analysis model representing an engineering product;

calculating a set of aspect-ratio based scale factors for each of the at least one fully-integrated 8-node hexahedral element, wherein the aspect-ratio based scale factors is defined according to formula:

$$\lambda_i^j = \min\left(1, \frac{L_j}{L_i}\right) i, j = 1, 2, 3$$

where $L_1$, $L_2$ and $L_3$ are respective lengths in three isoparametric dimensions of said each of the at least one fully-integrated 8-node hexahedral element, and $\lambda_i^j$ represents one of the set of aspect-ratio based scale factors;

creating an isoparametric Jacobian matrix of said each of the at least one fully-integrated 8-node hexahedral element by modifying, the isoparametric Jacobian matrix's off-diagonal terms with partial derivatives of an isoparametric shape function ($N_I$) that is derived from aspect-ratio based scale factors such that said each of the at least one fully-integrated 8-node hexahedral element's transverse shear locking effects are reduced; and conducting an engineering simulation using finite element analysis in the computer system with the finite element analysis model having the at least one fully-integrated 8-node hexahedral element and the modified isoparametric Jacobian matrix, the engineering simulation's results are used for assisting a user in making design decisions in improvement of the engineering product.

8. The computer readable medium of claim 7 wherein said partial deprvatives of the isoparametric shape function are modified from $$\frac{\partial N_I}{\partial \xi_j}(\xi_1, \xi_2, \xi_3) \text{ to } \frac{\partial N_I}{\partial \xi_j}(\lambda_1^j \xi_1, \lambda_2^j \xi_2, \lambda_3^j \xi_3), j = 1, 2, 3,$$

where $\xi_1$, $\xi_2$, and $\xi_3$ are isoparametric coordinates in the three isoparametric dimensions, respectively.

* * * * *